(12) United States Patent
Bonenfant et al.

(10) Patent No.: US 10,765,029 B2
(45) Date of Patent: Sep. 1, 2020

(54) METHOD FOR POSITIONING A RACK ONTO A BASE STRUCTURE

(71) Applicant: OVH, Roubaix (FR)

(72) Inventors: Jules Hermann Bonenfant, Lys lez Lannoy (FR); Christophe Maurice Thibaut, Houplin Ancoisne (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 16/037,639

(22) Filed: Jul. 17, 2018

(65) Prior Publication Data

US 2019/0182978 A1 Jun. 13, 2019

(30) Foreign Application Priority Data

Dec. 13, 2017 (EP) .................................. 17315013

(51) Int. Cl.
*H05K 7/14* (2006.01)
*H05K 5/00* (2006.01)
*A47B 47/00* (2006.01)

(52) U.S. Cl.
CPC ....... *H05K 7/1489* (2013.01); *A47B 47/0091* (2013.01); *H05K 5/0021* (2013.01); *H05K 7/1497* (2013.01)

(58) Field of Classification Search
CPC .. H05K 5/0021; H05K 7/1489; H05K 7/1497; A47B 47/0091
See application file for complete search history.

(56) References Cited

U.S. PATENT DOCUMENTS

| | | | | |
|---|---|---|---|---|
| 2,579,685 | A * | 12/1951 | Loose | B65D 19/385 108/53.5 |
| 5,231,246 | A * | 7/1993 | Benson | H05K 5/0021 174/135 |
| 5,335,144 | A | 8/1994 | Maroushek | |
| 5,725,324 | A * | 3/1998 | Pavelski | G06F 1/183 312/111 |
| 5,785,397 | A * | 7/1998 | Pavelski | F16B 5/0208 312/111 |

(Continued)

FOREIGN PATENT DOCUMENTS

| | | | | |
|---|---|---|---|---|
| DE | 29601864 | U1 * | 7/1996 | ......... B65D 21/0215 |
| DE | 10229034 | A1 * | 1/2004 | ........... H05K 5/0021 |

(Continued)

OTHER PUBLICATIONS

European Search Report with regard to the counterpart application EP17315013.7 dated Jun. 19, 2018.

(Continued)

*Primary Examiner* — Stanton L Krycinski
(74) *Attorney, Agent, or Firm* — BCF LLP

(57) ABSTRACT

A method of positioning a rack onto a base structure is provided. The rack includes a support member for supporting the rack on the base structure. The method includes: affixing a positioning tool to the base structure; aligning a guiding opening defined in the support member of the rack with the positioning tool affixed to the base structure; lowering the rack onto the base structure such that the guiding opening receives the positioning tool therein; and removing the positioning tool from the base structure once the rack is in a desired position atop the base structure.

11 Claims, 8 Drawing Sheets

(56) References Cited

U.S. PATENT DOCUMENTS

| | | | | |
|---|---|---|---|---|
| 5,980,160 | A * | 11/1999 | Vanderklaauw | B66F 1/00 405/230 |
| 5,992,953 | A * | 11/1999 | Rabinovitz | A47B 87/02 312/111 |
| 6,082,956 | A | 7/2000 | Pentland | |
| 6,167,670 | B1 * | 1/2001 | Reite | E04F 17/005 187/242 |
| 6,692,310 | B2 | 2/2004 | Zaderej | H01R 13/514 439/541.5 |
| 6,760,218 | B2 * | 7/2004 | Fan | H05K 5/0021 312/223.2 |
| 6,999,310 | B1 * | 2/2006 | Lai | G06F 1/184 312/223.2 |
| 7,836,656 | B2 * | 11/2010 | Crosbie | E04H 12/10 52/650.1 |
| 7,997,213 | B1 * | 8/2011 | Gauthier | B65D 88/129 108/53.1 |
| 8,113,478 | B2 | 2/2012 | Hsiao | |
| 8,172,098 | B2 * | 5/2012 | Eustace | A47B 47/021 211/189 |
| 8,985,716 | B2 * | 3/2015 | Lundrigan | A47B 87/0284 211/189 |
| 9,429,825 | B2 * | 8/2016 | Dundee | G03B 21/54 |
| 9,456,688 | B2 * | 10/2016 | Moyer | A47B 47/0091 |
| 9,532,484 | B2 * | 12/2016 | Franklin | H05K 7/1495 |
| 9,676,517 | B2 * | 6/2017 | Jiang | B65D 19/0073 |
| 9,686,882 | B2 | 6/2017 | Bailey et al. | |
| 9,701,330 | B2 | 7/2017 | Mkandawire et al. | |
| 9,924,613 | B2 * | 3/2018 | Pace | F16M 13/00 |
| 10,320,112 | B2 * | 6/2019 | Kaplan | H01R 13/514 |
| 2008/0135506 | A1 * | 6/2008 | Peters | B65D 19/10 211/49.1 |
| 2011/0174753 | A1 * | 7/2011 | Pinto | A47F 5/137 211/153 |
| 2014/0036442 | A1 | 2/2014 | Giannoglou et al. | |
| 2014/0239139 | A1 * | 8/2014 | Opsomer | G09F 9/33 248/329 |
| 2015/0266616 | A1 * | 9/2015 | Barrable | B65D 88/022 206/512 |
| 2018/0063972 | A1 * | 3/2018 | Yang | H05K 5/0004 |

FOREIGN PATENT DOCUMENTS

| | | |
|---|---|---|
| EP | 1249750 A1 | 10/2002 |
| EP | 1229775 B1 | 6/2010 |
| WO | 2014191532 A1 | 12/2014 |

OTHER PUBLICATIONS

English Abstract for EP1249750 retrieved on Espacenet on Jul. 12, 2018.

English Abstract for EP1229775 retrieved on Espacenet on Jul. 12, 2018.

* cited by examiner

METHOD FOR POSITIONING A RACK ONTO A BASE STRUCTURE

CROSS-REFERENCE TO RELATED APPLICATION(S)

This United States Non-Provisional Patent Application relies for priority on European Patent Application Serial No. EP 17315013.7, filed on Dec. 13, 2017, the entire content of which is incorporated herein by reference.

FIELD OF TECHNOLOGY

The present technology relates to a method for positioning a rack onto a base structure.

BACKGROUND

Racks are used across various industries as a storage solution. For instance, data centers are typically equipped with multiple racks for storing servers therein.

In some cases, the racks are stacked atop one another to maximize the use of space within the data center. However, moving and stacking these racks can be logistically difficult due to the significant size and weight of the racks. Notably, correctly aligning one rack atop another is a time-consuming and hazardous task. Similarly, even moving the racks with a forklift or other such work vehicle can present difficulties as it can be time-consuming to correctly position the rack on a pallet for the forklift to move the rack around.

There is therefore a desire for a method for positioning a rack atop another rack or other base structure which can alleviate at least some of these drawbacks.

SUMMARY

It is an object of the present technology to ameliorate at least some of the inconveniences present in the prior art.

According to one aspect of the present technology, there is provided a method of positioning a rack onto a base structure. The rack includes a support member for supporting the rack on the base structure. The method includes: affixing a positioning tool to the base structure; aligning a guiding opening defined in the support member of the rack with the positioning tool affixed to the base structure; lowering the rack onto the base structure such that the guiding opening receives the positioning tool therein; and removing the positioning tool from the base structure once the rack is in a desired position atop the base structure.

In some implementations of the present technology, the positioning tool includes at least one projection. The base structure defines at least one tool-locating opening for receiving a respective one of the at least one projection therein. Affixing the positioning tool includes inserting the at least one projection of the positioning tool into a respective one of the at least one tool-locating opening defined in the base structure.

In some implementations of the present technology, removing the positioning tool includes lifting the positioning tool such that the at least one projection disengages the at least one tool-locating opening of the base structure and the guiding opening of the rack.

In some implementations of the present technology, the positioning tool is affixed to the base structure without using any implement.

In some implementations of the present technology, the positioning tool is removed from the base structure without using any implement.

In some implementations of the present technology, the method includes, after lowering the rack onto the base structure, sliding the rack relative to the base structure in a longitudinal direction of the rack such that a first end of the guiding opening abuts a corresponding first end of the positioning tool.

In some implementations of the present technology, a first end portion of the guiding opening and a corresponding first end portion of the positioning tool are V-shaped such that abutting the first end of the guiding opening with the corresponding first end of the positioning tool centers the rack relative to the base structure.

In some implementations of the present technology, the support member is a first support member. The rack includes a second support member for supporting the rack on the base structure, the second support member being spaced apart from the first support member in a lateral direction of the rack. The positioning tool is a first positioning tool. The method further includes: affixing a second positioning tool to the base structure; aligning a guiding opening defined in the second support member of the rack with the second positioning tool affixed to the base structure; lowering the rack onto the base structure such that the guiding opening of the second support member receives the second positioning tool therein; and removing the second positioning tool from the base structure once the rack is in the desired position atop the base structure.

In some implementations of the present technology, the rack is a first rack. The base structure is a second rack. The second rack has an upper support member for supporting the first rack. The positioning tool is affixed to the upper support member of the second rack.

In some implementations of the present technology, the base structure is a pallet for transporting the rack.

In some implementations of the present technology, the rack is a server rack.

In some implementations of the present technology, the at least one projection includes a first projection and a second projection.

In some implementations of the present technology, each of the at least one projection is a fastener that is fastened to a body of the positioning tool.

According to another aspect of the present technology, there is provided a rack assembly. The rack assembly includes a lower rack, an upper rack and a positioning tool. The lower rack includes: a first upper support member and a second upper support member spaced apart from the first upper support member in a lateral direction of the lower rack. The second upper support member defines at least one tool-locating opening. The upper rack is stacked atop the lower rack. The upper rack includes: a first lower support member and a second lower support member spaced apart from the first lower support member in a lateral direction of the upper rack. The second lower support member defines a guiding opening. The positioning tool is affixed to the lower rack and includes a body extending from a first end to a second end. The body has a lower side and an upper side. The body of the positioning tool is received in the guiding opening of the upper rack. The positioning tool also includes at least one projection projecting from the lower side of the body. The at least one projection is inserted into a respective one of the at least one tool-locating opening of the lower rack. The positioning tool is removable from the lower rack and the upper rack when the upper rack is stacked atop the lower rack.

In some implementations of the present technology, the upper rack is slidable relative to the lower rack along a longitudinal direction of the upper rack such that the positioning tool slides within the guiding opening.

In some implementations of the present technology, the guiding opening of the upper rack extends from a first end to a second end. A first end portion of the guiding opening and a first end portion of the body of the positioning tool are V-shaped such that, when the first end of the guiding opening abuts the first end of the body, the upper rack is centered relative to the lower rack along the lateral direction of the upper rack.

In some implementations of the present technology, the at least one tool-locating opening includes a first tool-locating opening and a second tool-locating opening. The at least one projection includes a first projection and a second projection. The first projection is inserted into the first-tool locating opening and the second projection is inserted into the second tool-locating opening.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
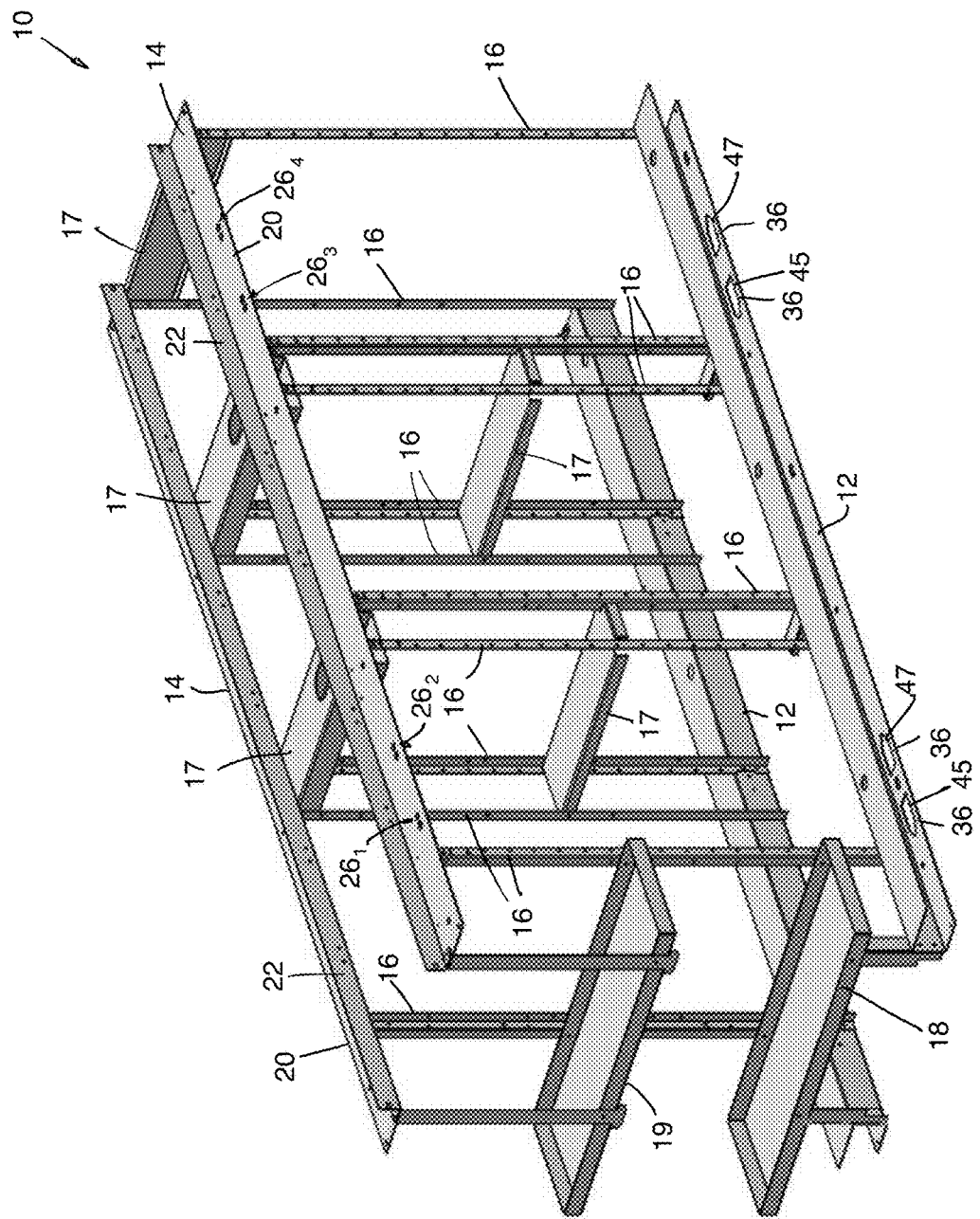
FIG. 1 is a front, left perspective view of a rack.

FIG. 1 illustrates a rack 10 for storing articles. In this implementation, the rack 10 is a server rack configured for storing servers therein (not shown). For instance, multiple racks such as the rack 10 could be used in a data center to store a multitude of servers. For example, the rack 10 could withstand a load of up to 3 tonnes. It is understood that, in other implementations, the rack 10 could be used for storing other types of articles.

The rack 10 includes front and rear support members 12 and front and rear upper support members 14 disposed vertically above the lower support members 12. As will be discussed in more detail below, the lower support members 12 are configured to support the rack 10 on a base structure 200 (FIG. 9) while the upper support members 14 are configured to support another rack stacked atop the rack 10.

The lower support members 12 are laterally spaced apart from one another. Similarly, the upper support members 14 are laterally spaced apart from one another. The upper and lower support members 12, 14 are elongated and extend horizontally along a longitudinal direction of the rack 10. The rack 10 also includes a plurality of vertical members 16 extending from the lower support members 12 to the upper support members 14. The vertical members 16 are configured to attach shelves thereto (not shown) for placing the stored articles thereon. To that end, the vertical members 16 define openings for attaching shelves thereto. The vertical members 16 are fastened to the lower and upper support members 12, 14 via welding or in any other suitable manner (e.g., fasteners). The rack 10 also includes supports 17 extending between certain of the laterally-adjacent ones of the vertical members 16. The lateral supports 17 are attached to the selected ones of the vertical members 16 in any suitable way (e.g., welding, fasteners, etc.). The rack 10 also includes platforms 18, 19 for supporting battery packs. The platforms 18, 19 are located at an end of the rack 10 and connected to the lower and upper support members 12, 14 respectively. The platforms 18, 19 are also fastened to the vertical support members 16.

Figure 2:
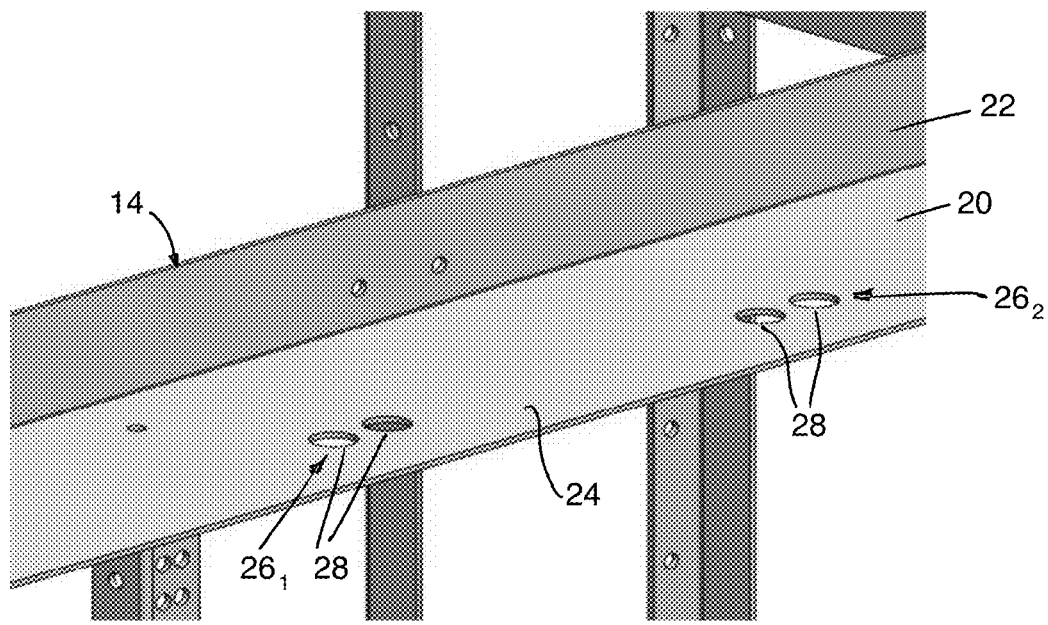
FIG. 2 is a detailed view of part of an upper support member of the rack of FIG. 1.

With reference to FIG. 2, each upper support member 14 is generally L-shaped having a horizontal portion 20 and a vertical portion 22 perpendicular to the horizontal portion 20. The horizontal portion 20 has an upper surface 24 and an opposite lower surface (not shown). The horizontal portion 20 defines tool-locating openings 28 for affixing a tool to the upper support member 14. More particularly, the tool-locating openings 28 are grouped in sets $26_1$-$26_4$ spaced apart longitudinally. More specifically, the two sets $26_1$, $26_2$ are located in a longitudinal half of the rack 10 (i.e., on one side of a plane longitudinally bisecting the rack 10) while the two other sets $26_3$, $26_4$ are located in the opposite longitudinal half of the rack 10. Each set $26_i$ includes two tool-locating openings 28 which are longitudinally-adjacent one another. In this implementation, the tool-locating openings 28 are circular.

Figure 3:
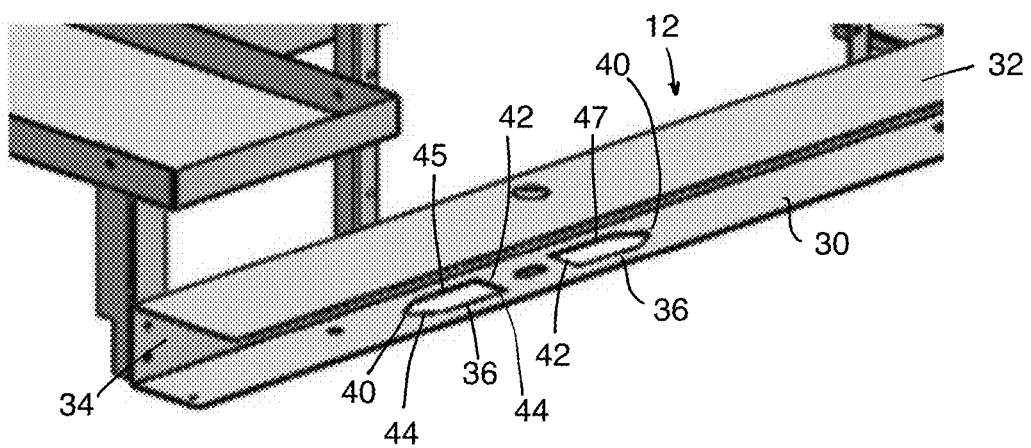
FIG. 3 is a detailed view of part of a lower support member of the rack of FIG. 1.

With reference to FIG. 3, each lower support member 12 is generally U-shaped having two horizontal portions 30, 32 opposite one another and a vertical portion 34 between the horizontal portions 30, 32. The horizontal portions 30, 32 include a lower horizontal portion 30 and an upper horizontal portion 32. The lower horizontal portion 30 defines guiding openings 36 for guiding the positioning of the rack 10 atop the base structure 200 as will be described in more detail below. Each of the guiding openings 36 has a first end 40 and a second end 42 opposite the first end 40. A first end portion 44 of each guiding opening 36, terminating at the first end 40, is V-shaped, while a second end portion 46, terminating at the second end 42, is generally square. The number of guiding openings 36 of each lower support member 12 is equal to the number of sets of openings $26_1$-$26_4$ of each upper support member 14 (i.e., four in this example).

Each guiding opening 36 is longitudinally aligned with a corresponding set of openings $26_1$-$26_4$ such that, in the longitudinal direction of the rack 10, a center of each of the tool-locating openings 28 is positioned to overlap, in the longitudinal direction of the rack 10, a corresponding one of the guiding openings 36. Furthermore, the guiding openings 36 can be grouped as leftward-facing guiding openings 45 and rightward-facing guiding openings 47. The leftward-facing guiding openings 45 are those of the guiding openings 36 that have the first end portion 44 (i.e., the V-shaped end portion) pointed toward the left. Similarly, the rightward-facing guiding openings 47 are those of the guiding openings 36 that have the first end portion 44 pointed toward the right.

While FIGS. 2 and 3 show the left lower and upper support members 12, 14, it is understood that, in this implementation, the right lower and upper support members 12, 14 are mirror images of the left lower and upper supports members 12, 14 taken about a longitudinal centerplane bisecting the rack 10 laterally.

In some cases it may be desirable to stack the rack 10 atop another rack 10' (FIG. 9) in order to efficiently use any available vertical space. Thus, in this case, the base structure 200 onto which the rack 10 is to be positioned is the rack 10'. The structure of the rack 10' is identical to that described above with respect to the rack 10 with like parts being numbered with like reference numbers.

Figure 4:
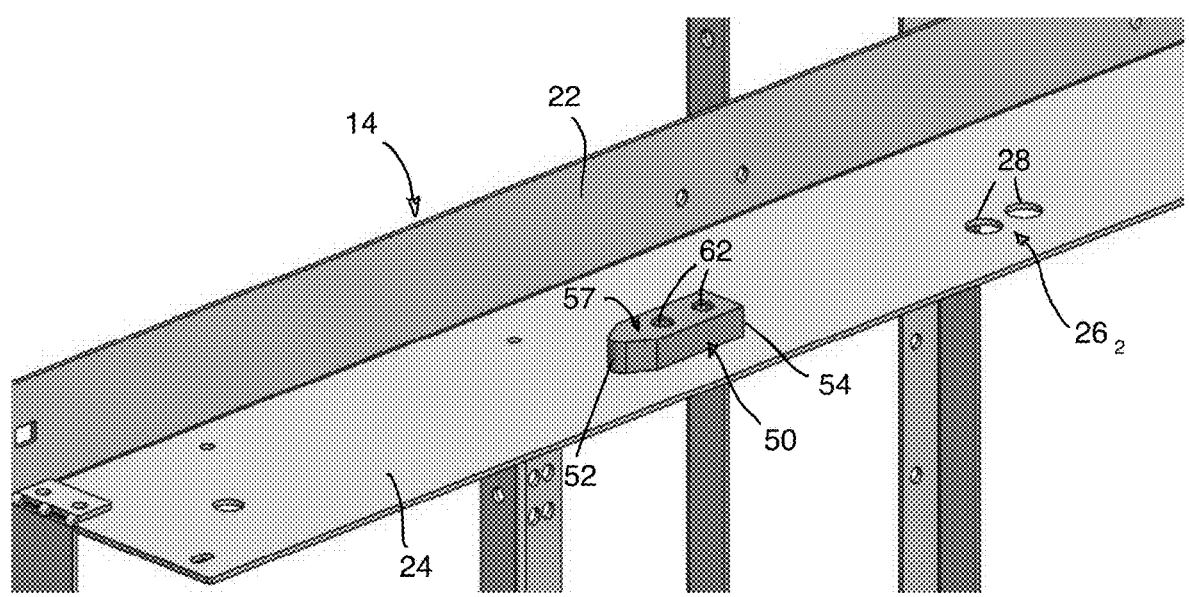
FIG. 4 is a front, left perspective view showing a positioning tool affixed to the upper support member of the rack of FIG. 1.
Figure 5:
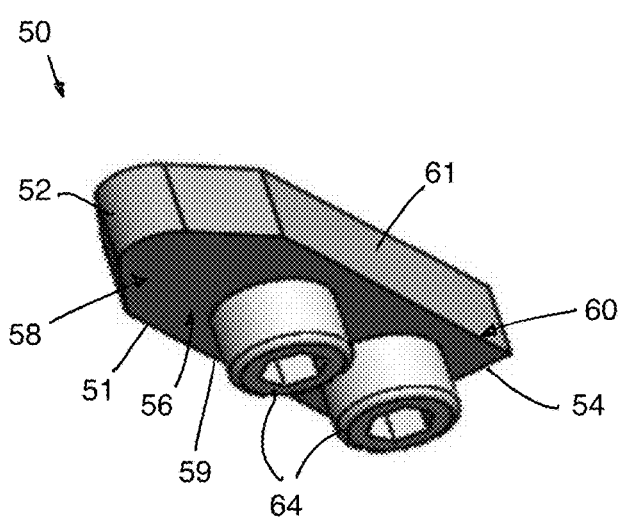
FIG. 5 is a perspective view of the positioning tool of FIG. 4.

A positioning tool 50 is provided for use with the racks 10, 10' in order to facilitate stacking and relative positioning thereof. As shown in FIGS. 4 and 5, the positioning tool 50 has a body 51 extending from a first end 52 to a second end 54 and having a lower side 56 and an opposite upper side 57. A first end portion 58 of the body 51, terminating at the first end 52, is V-shaped such that the first end 52 is a tip of the V-shape of the first end portion 58. A second end portion 60 of the body 51, terminating at the second end 54, is generally flat and rectangular. The body 51 defines two openings 62 extending from the upper side 58 to the lower side 56. The openings 62 are spaced apart from one another along a longitudinal direction of the positioning tool 50. More particularly, a longitudinal distance between the two openings 62 is the same as a longitudinal distance between the two openings 28 of any of the sets of openings $26_1$-$26_4$.

The positioning tool 50 also includes two fasteners 64 (e.g., bolts) which are inserted into the openings 62 from the lower side 56 of the body 51 such that a head of each of the fasteners 64 projects from the lower side 56 of the body 51 thus forming a pair of "projections". The openings 62 are threaded to securely engage the fasteners 64. It is contemplated that, rather than having fasteners engaged in openings, the positioning tool 50 could have projections that are integrally formed with the body 51 in other implementations.

Figure 6:
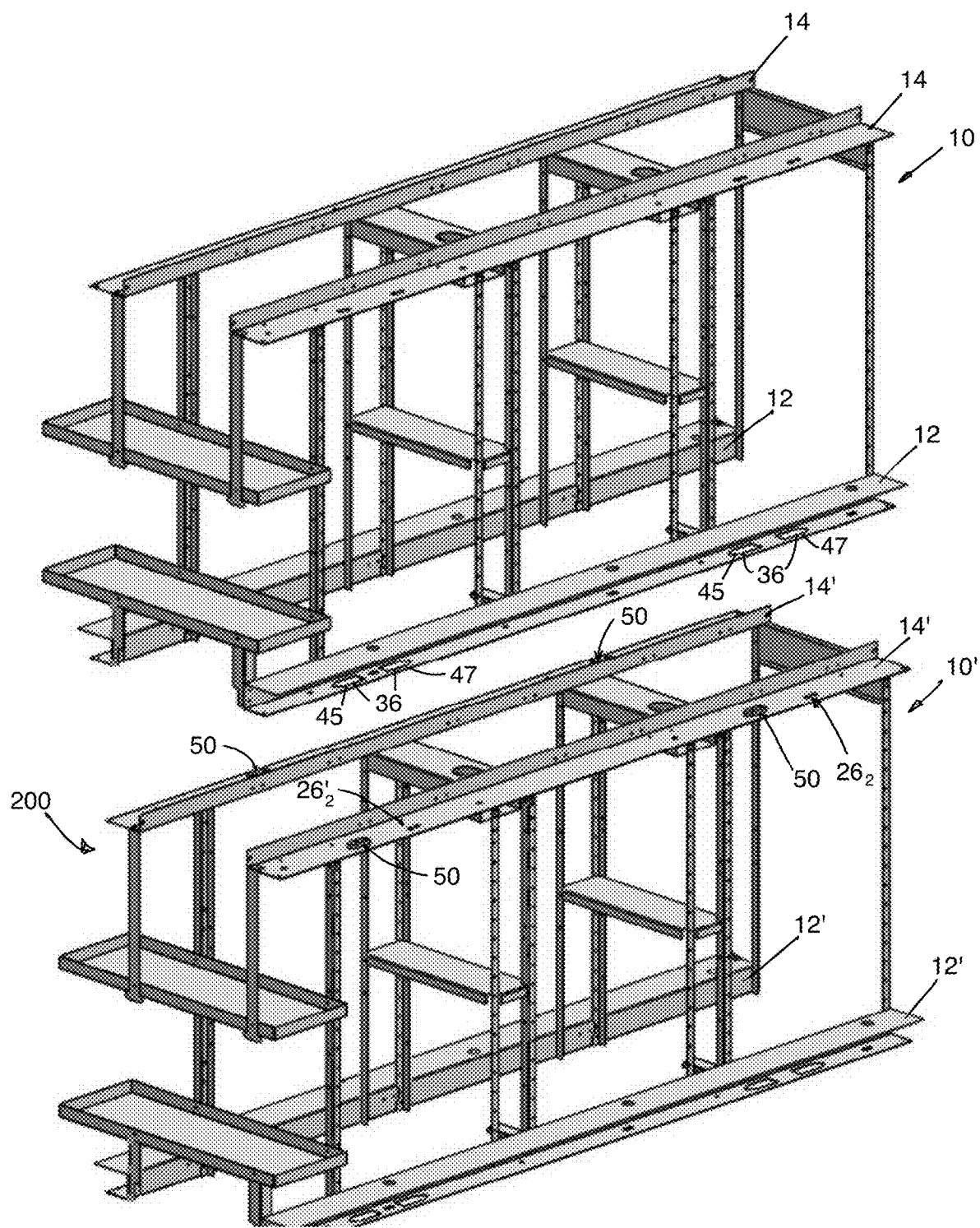
FIG. 6 shows the rack of FIG. 1 lifted atop a lower rack and aligned with the positioning tool affixed to the lower rack.

As shown in FIG. 6, in order to stack the rack 10 atop the rack 10' (which will be referred to as the upper rack 10 and the lower rack 10' respectively), four such positioning tools 50 are affixed to the upper support members 14' of the lower rack 10' (two positioning tools 50 affixed to each of the upper support members 14'). More particularly, the positioning tools 50 are engaged either with the sets of openings $26'_1$, $26'_3$ (corresponding to the leftward-facing guiding openings 45) or with the sets of openings $26'_2$, $26'_4$ (corresponding to the rightward-facing guiding openings 47). In particular, the heads of the fasteners 64 of each positioning tool 50 are inserted into the tool-locating openings 28' of a given set of openings $26'_i$.

It is noted that the positioning tools 50 are not fastened to the lower rack 10' but rather simply superimposed thereon such that the lower side 56 of the body 51 of each positioning tool 50 rests atop the upper surface 24' of an upper support members 14' of the lower rack 10'. As such, the positioning tools 50 are affixable to the lower rack 10' without using any implements (e.g., a screwdriver, a hammer, pliers, etc.).

In this implementation, the heads of the fasteners 64 are generally circular and thus two fasteners 64 are provided for insertion into corresponding ones of the tool-locating openings 28' such that the positioning tool 50 is generally fixed in the lateral and longitudinal directions of the lower rack 10'. However, it is contemplated that, in alternative implementations, rather than having circular projections, the positioning tool 50 could have a single rectangular projection configured to mesh with a correspondingly-shaped tool-locating opening. Such a rectangular shape of the projection and tool-locating opening would generally fix the positioning tool 50 in the lateral and longitudinal directions of the lower rack 10'.

Figure 7:
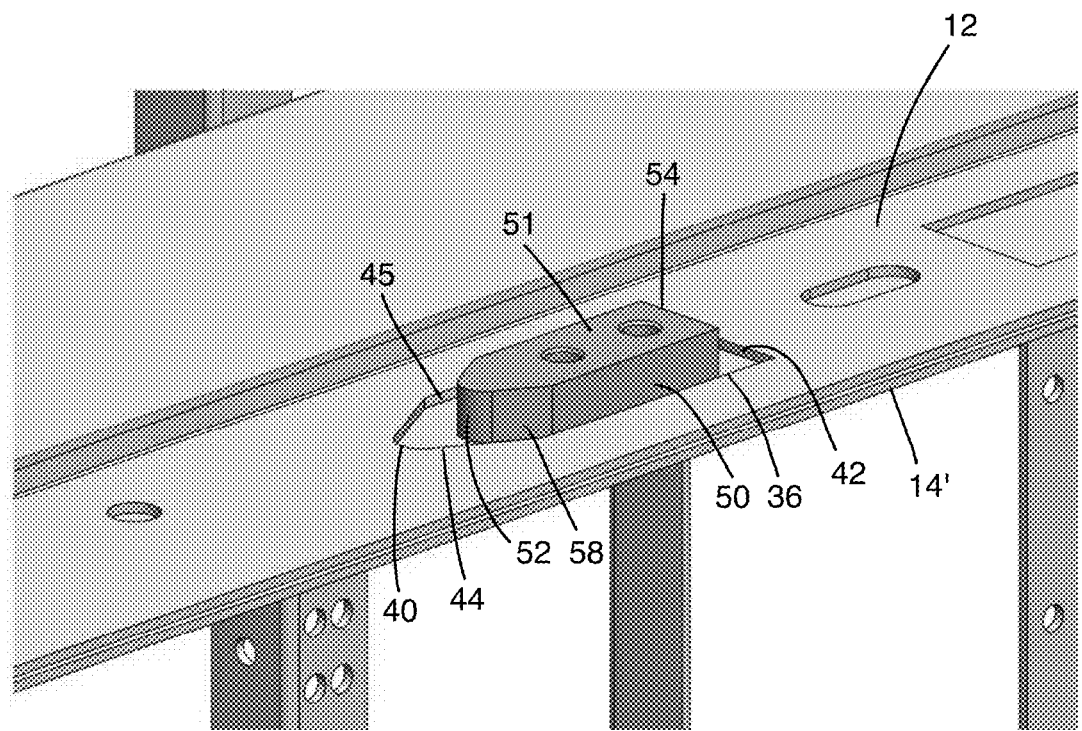
FIG. 7 shows the positioning tool received in a guiding opening of the lower support member of the rack of FIG. 1 after lowering the rack atop the lower rack.

Next, the upper rack 10 is lifted above the lower rack 10'. For instance, a forklift can be used to engage the upper horizontal portion 32 of the lower support members 12 to lift the upper rack 10 above the lower rack 10'. With the positioning tools 50 in place on the lower rack 10', the guiding openings 36 of the upper rack 10 corresponding to the tool-locating openings 28' in which the positioning tools 50 are inserted are then aligned with the positioning tools 50. As shown in FIG. 7, the upper rack 10 is then lowered onto the lower rack 10' such that each of the aligned guiding openings 36 receives the body 51 of the corresponding positioning tool 50 therein. The lower surface of the lower horizontal portion 30 of the lower support members 12 is thus in contact with the upper surface 24' of the upper support members 14'.

The length of each guiding opening 36, measured from the first end 40 to the second end 42, is greater than the length of the positioning tool 50, measured from the first end 52 to the second end 54. Similarly, the width of each guiding opening 36, measured between lateral edges 55, 57 (FIG. 8), is greater than the width of the positioning tool 50, measured between opposite lateral sides 59, 61 of the body 51 (FIG. 5). As such, when the positioning tool 50 is received in the guiding opening 36, the upper rack 10 is not necessarily aligned longitudinally and/or laterally relative to the lower rack 10'.

Figure 8:
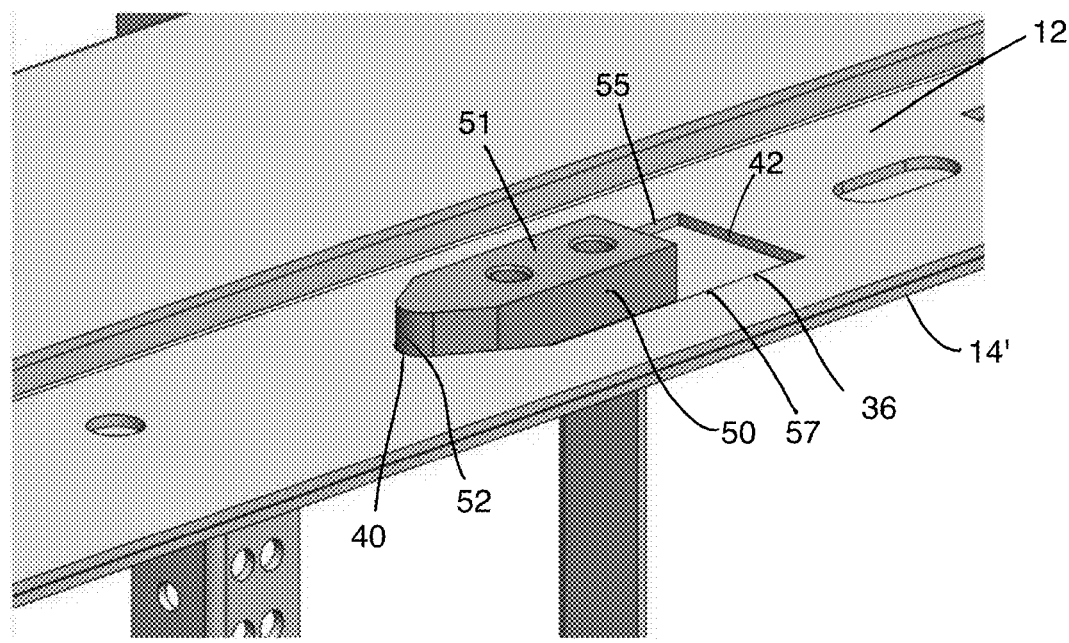
FIG. 8 shows the positioning tool in a laterally centered position relative to the guiding opening.

To that end, once the upper rack 10 is on the lower rack 10' with the positioning tools 50 received in the guiding openings 36, as shown in FIG. 8, the upper rack 10 is slid relative to the lower rack 10' in the longitudinal direction of the upper rack 10 (such that each positioning tool 50 slides within the associated guiding opening 36) until the first end 52 of each positioning tool 50 is abutted by the first end 40 of the guiding opening 36 in which the positioning tool 50 is received. Due to their V-shape, when the first end portion 58 of each positioning tool 50 slidingly engages the first end portion 44 of the corresponding guiding opening 36, the upper rack 10 is laterally centered relative to the lower rack 10' (if not already centered previously). Once the first end 52 of each positioning tool 50 engages the first end 40 of the corresponding guiding opening 36, the upper and lower racks 10, 10' are laterally and longitudinally centered relative to the lower rack 10'.

Figure 9:
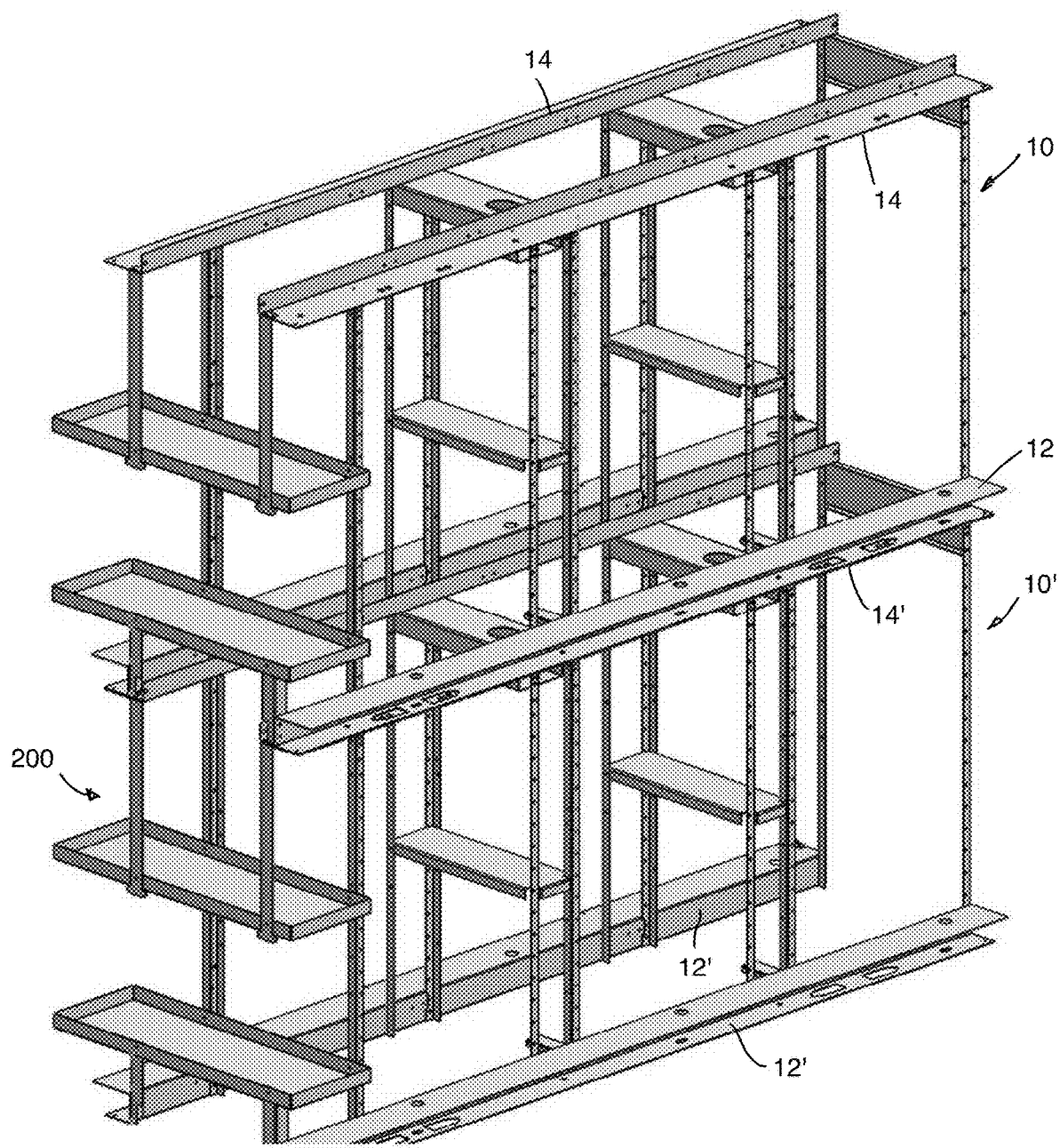
FIG. 9 shows a front, left perspective view of a rack assembly including the rack of FIG. 1 positioned atop the lower rack after the positioning tool is removed therefrom.

With the rack 10 in its desired position atop the lower rack 10', the positioning tools 50 can then be removed from the lower rack 10' and the upper rack 10 without moving either of the racks 10, 10' from their stacked positions. Notably, since the positioning tools 50 are superimposed onto the lower rack 10' (i.e., not fastened thereto), the positioning tools 50 can be removed by lifting the positioning tools 50 causing the heads of the fasteners 64 to disengage the tool-locating openings 28 of the lower rack 10' and the guiding openings 36 of the upper rack 10, leaving the racks 10, 10' correctly center with respect to one another (FIG. 9). In other words, the positioning tools 50 are removed from the lower rack 10' and the upper rack 10 without using any implement.

The user may then secure the racks 10, 10' together in any suitable manner. For example, the racks 10, 10' may be fastened together by inserting fasteners (not shown) in corresponding openings of each rack 10, 10'.

While four positioning tools 50 are used in this implementation, fewer positioning tools may be used in other implementations. For instance, in some implementations, only three positioning tools 50 may be used. Moreover, while in this implementation the four positioning tools 50 are affixed to the lower rack 10' prior to stacking the upper rack 10 atop the lower rack 10', in alternative implementations, only two (or three) of the positioning tools 50 may be affixed to the lower rack 10' until after the upper rack 10 is stacked atop the lower rack 10'. The additional positioning tool(s) 50 would then be affixed to the lower rack 10' once the upper rack 10 is atop the lower rack 10' such that the sliding of the racks 10, 10' relative to one another is done with the three or four positioning tools 50 affixed to the lower rack 10'. As such, when the guiding openings 36 abut the positioning tools 50, the force exerted on the positioning tools 50 may be distributed on a greater number of positioning tools.

Positioning the rack 10 atop the lower rack 10' by using the positioning tool 50 in the manner prescribed above may facilitate the process of correctly positioning the racks 10, 10' relative to one another. Notably, due to the auto-centering capability afforded by the positioning tool 50, stacking the racks 10, 10' may be relatively faster and safer than if no positioning tool were used.

Figure 10:
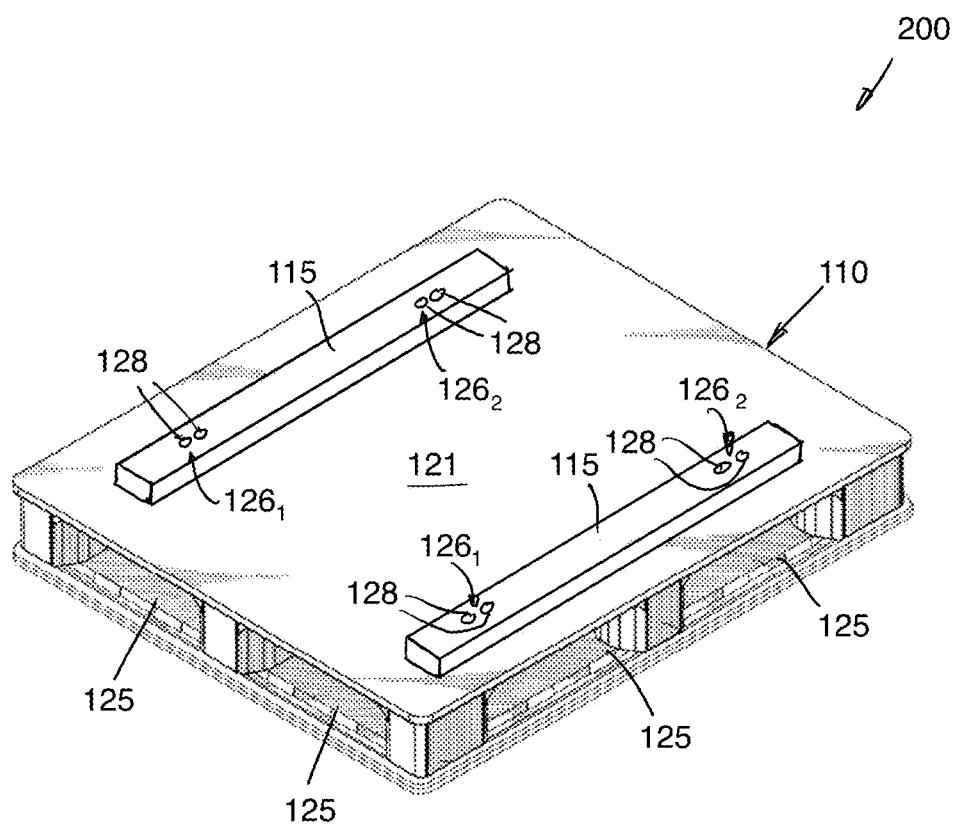
FIG. 10 is a front, left perspective view of a pallet structured to receive the positioning tool such as to position the rack of FIG. 1 atop the pallet.

While in the implementation described above, the base structure 200 onto which the rack 10 is stacked is the lower rack 10', the base structure 200 may be any other structure onto which the rack 10 can be positioned. For instance, with reference to FIG. 10, in an alternative implementation, the base structure 200 is a pallet 110 for transporting the rack 10. The pallet 110 is configured for being lifted by a forklift or other work vehicle and, to that end, comprises fork-receiving openings 125. The pallet 110 has a top platform 121 and two supports 115 affixed to the platform 121 (e.g., by fasteners (not shown)). Each of the supports 115 defines tool-locating openings 128 for receive respective ones of the fasteners 64 of the positioning tool 50. Similarly, the tool-locating openings 128 are grouped in sets of openings $126_1$, $126_2$ of each support 115. The rack 10 can thus be positioned atop the pallet 110 in a similar manner to that described above with respect to the lower rack 10'. Notably, once the positioning tools 50 are in place in the tool-locating openings 128, the lower support members 12 of the rack 10 are made to engage the pallet 110 such that the positioning tools 50 are received in the guiding openings 36. In this way, transporting the rack 10 may also be made safer and quicker.

Figure 11:
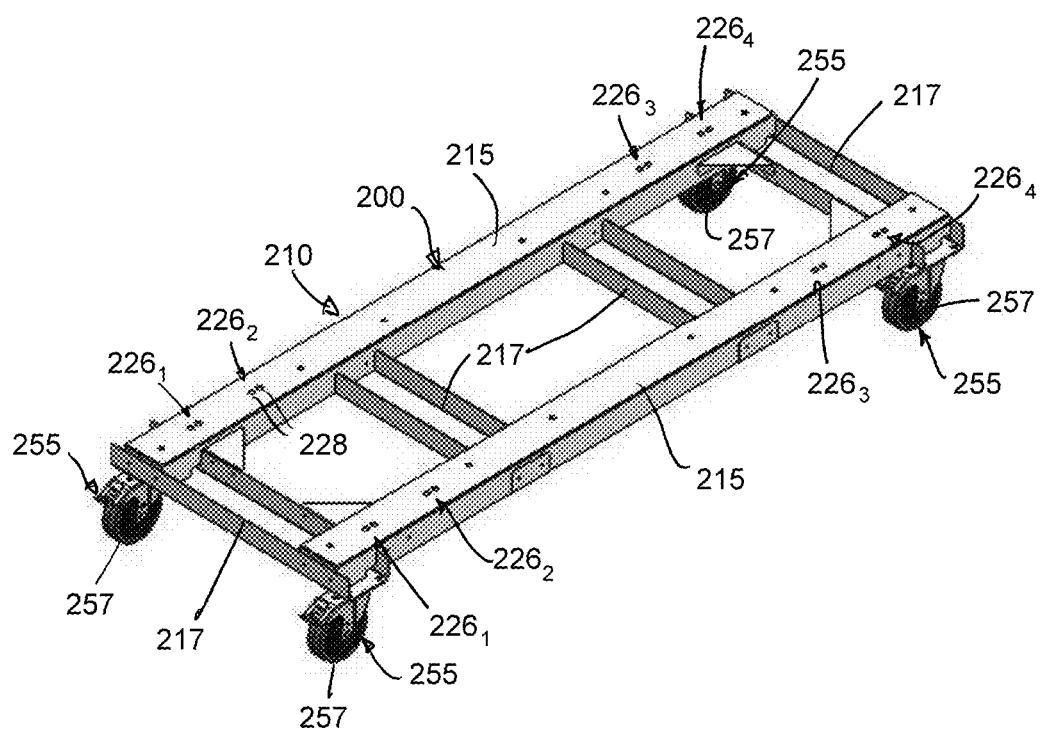
FIG. 11 is a front left, perspective view of a wheeled device structured to receive the positioning such as to position the rack of FIG. 1 atop the wheeled device.

FIG. 11 shows another alternative implementation in which the base structure 200 is part of a wheeled device 210. In this example, the wheeled device 210 is a wheeled dolly comprising longitudinal supports 215 and lateral supports 217 interconnecting the longitudinal supports 215 such that, together, the longitudinal and lateral supports 216, 217 form a platform. Each of the longitudinal supports 215 defines tool-locating openings 228 for receive respective ones of the fasteners 64 of the positioning tool 50. Similarly, the tool-locating openings 228 are grouped in sets of openings $226_1$-$226_4$ of each support 215. The wheeled device 210 also includes four wheel assemblies 255 affixed to a lower side of the platform formed by the longitudinal and lateral supports 216, 217 (one wheel assembly 255 at each corner of the platform), each of the wheel assemblies 255 including a wheel 257 for engaging a ground surface. In this example, the wheel assemblies 255 are caster assemblies and the wheels 257 are caster wheels. In other examples, some or all of the wheel assemblies 255 may be configured to roll in a single direction. The rack 10 can thus be positioned atop the wheeled device 210 in a similar manner to that described above with respect to the lower rack 10'. Notably, once the positioning tools 50 are in place in the tool-locating openings 228, the lower support members 12 of the rack 10 are made to engage the wheeled device 210 such that the positioning tools 50 are received in the guiding openings 36.

The wheeled device 210 may be any other suitable wheeled device in other implementations such as, for example, a pallet jack, a forklift, or any other suitable work vehicle. In such instances, the wheeled device 210 may lack the lateral supports 217 but could be provided with members similar to the longitudinal supports 215 for receiving the position tools 50.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method of positioning a rack onto a base structure, the rack comprising a support member for supporting the rack on the base structure, the method comprising:
   affixing a positioning tool to the base structure;
   aligning a guiding opening defined in the support member of the rack with the positioning tool affixed to the base structure;
   lowering the rack onto the base structure such that the guiding opening receives the positioning tool therein as the rack is being lowered onto the base structure; and
   sliding the rack relative to the base structure in a longitudinal direction of the rack such that a first end of the guiding opening abuts a corresponding first end of the positioning tool, wherein a first end portion of the guiding opening and a corresponding first end portion of the positioning tool are V-shaped such that abutting the first end of the guiding opening with the corresponding first end of the positioning tool centers the rack relative to the base structure.

2. The method of claim 1, wherein:
   the positioning tool comprises at least one projection;

the base structure defines at least one tool-locating opening for receiving a respective one of the at least one projection therein; and said affixing the positioning tool comprises inserting the at least one projection of the positioning tool into a respective one of the at least one tool-locating opening defined in the base structure.

3. The method of claim 1, further comprising:

removing the positioning tool from the base structure once the rack is in a desired position atop the base structure.

4. The method of claim 3, wherein:

the positioning tool comprises at least one projection;

the base structure defines at least one tool-locating opening for receiving a respective one of the at least one projection therein;

said affixing the positioning tool comprises inserting the at least one projection of the positioning tool into a respective one of the at least one tool-locating opening defined in the base structure; and said removing the positioning tool comprises lifting the positioning tool such that the at least one projection disengages the at least one tool-locating opening of the base structure and the guiding opening of the rack.

5. The method of claim 1, wherein the positioning tool is affixed to the base structure without using any implement.

6. The method of claim 1, wherein the positioning tool is removed from the base structure without using any implement.

7. The method of claim 1, wherein:

the support member is a first support member;

the rack comprises a second support member for supporting the rack on the base structure, the second support member being spaced apart from the first support member in a lateral direction of the rack;

the positioning tool is a first positioning tool; and the method further comprises:

affixing a second positioning tool to the base structure;

aligning a guiding opening defined in the second support member of the rack with the second positioning tool affixed to the base structure; and lowering the rack onto the base structure such that the guiding opening of the second support member receives the second positioning tool therein as the rack is being lowered onto the base structure.

8. The method of claim 1, wherein:

the rack is a first rack;

the base structure is a second rack;

the second rack has an upper support member for supporting the first rack; and the positioning tool is affixed to the upper support member of the second rack.

9. The method of claim 1, wherein the base structure is a pallet for transporting the rack.

10. The method of claim 2, wherein the at least one projection includes a first projection and a second projection.

11. The method of claim 1, wherein the guiding opening receives the positioning tool therein prior to sliding the rack relative to the base structure.

* * * * *